United States Patent [19]
Ema et al.

[11] Patent Number: 5,570,311
[45] Date of Patent: Oct. 29, 1996

[54] SRAM SEMICONDUCTOR DEVICE

[75] Inventors: Taiji Ema; Kazuo Itabashi; Kazuhiro Mizutani, all of Kawasaki, Japan

[73] Assignee: Fujitsu Limited, Kawasaki, Japan

[21] Appl. No.: 189,142

[22] Filed: Jan. 31, 1994

[30] Foreign Application Priority Data

Apr. 30, 1993 [JP] Japan ................................ 5-104649
Dec. 15, 1993 [JP] Japan ................................ 5-315274

[51] Int. Cl.$^6$ ................................................ G11C 11/00
[52] U.S. Cl. ....................... 365/154; 365/156; 257/536; 257/537; 257/904
[58] Field of Search ............................ 365/154, 190, 365/156; 257/336, 536, 903, 904, 537

[56] References Cited

U.S. PATENT DOCUMENTS

| 4,995,000 | 2/1991 | Terrell ................................ 365/154 |
| 5,172,211 | 12/1992 | Godinho et al. ................... 257/536 |
| 5,239,196 | 8/1993 | Ikeda et al. ..................... 365/154 X |
| 5,377,140 | 12/1994 | Usuki ............................... 365/154 |

FOREIGN PATENT DOCUMENTS 5-63159  3/1993  Japan .

OTHER PUBLICATIONS

Ohkubo et al., 16M bit SRAM Cell Technologies for 2.0V Operation, IEDM Technical Digest 1991, pp. 481–484.

Primary Examiner—David C. Nelms
Assistant Examiner—Huan Hoang
Attorney, Agent, or Firm—Armstrong, Westerman, Hattori, McLeland & Naughton

[57] ABSTRACT

An SRAM semiconductor device having a parallel connection of two series circuits each having a driver transistor and a load connected in series, a wiring for connecting an interconnection point between the driver transistor and load of each of the two series circuits to a control terminal of the driver transistor of the other of the two series circuits, and a transfer transistor connected to each interconnection point, wherein the driver transistor and transfer transistor each are an insulating gate field effect transistor having a channel region formed on the surface of a semiconductor substrate at a predetermined area, source/drain regions on both sides of the channel region, and an insulated gate above the channel region, and the transfer transistor has a resistor region having an impurity concentration lower than the source/drain regions on both sides of the channel region of the driver transistor, the resistor region being contiguous to the channel region of the transfer transistor.

11 Claims, 8 Drawing Sheets

SRAM SEMICONDUCTOR DEVICE

BACKGROUND OF THE INVENTION a) Field of the Invention

The present invention relates to a semiconductor device, and more particularly to a static random access memory (SRAM) semiconductor device.

b) Description of the Related Art

In SRAMs, two series circuits of a driver transistor and a load are connected between a supply voltage line and a ground voltage line. The interconnection point of the driver transistor and load is connected to the control terminal of the other driver transistor, and connected via a transfer gate transistor to a bit line. The control terminal of the transfer transistor is connected to a word line. The loads are formed by resistors or transistors.

For example, driver transistors and transfer transistors are made of MOS transistors formed on the surface of a Si substrate, and loads are made of polycrystalline silicon thin film transistors (TFT) formed on an insulating film on the Si substrate.

In order to improve the degree of integration, it is desired to reduce the area of an SRAM cell and miniaturize each transistor. In a memory read operation, the driver transistor is connected via the transfer transistor to the bit line. If the bit line takes a high potential and the driver transistor is in an on-state, a voltage between the bit line and ground is divided by the transfer transistor and driver transistor. If the drive performance of the driver transistor is not sufficient, the potential at the interconnection point rises, resulting in an unstable condition and reversion of a memory state.

The drive performance ratio between the transfer transistor and driver transistor is quite important in terms of an operating margin of an SRAM cell (refer, for example, to E. Seevinck et al., IEEE J. Solid-State Circuits, Vol.SC-22, No.5, 1987, pp.748–754). This drive performance ratio is generally called a cell ratio.

In order to stabilize the operation of a memory cell, it is necessary to make the cell ratio sufficiently large so that the operation of a driver transistor is stabilized even during the on-state of the transfer transistor. As the operating voltage lowers, the necessary cell ratio becomes large.

In order to increase the cell ratio, it is generally necessary to increase the channel width of a driver transistor. However, increasing the channel width of a driver transistor results in an increase of the memory cell area.

Recent memory cells have a considerably high degree off integration. There is a tendency that an operation voltage is lowered so as to reduce the power dissipation. Even if the operating voltage is lowered, a larger cell ratio is required to provide a stable operation of an SRAM cell.

If the channel width of a driver transistor is made wider to increase the cell ratio, the memory cell area becomes very large which restrains high integration.

To solve this problem, it has been proposed to add a resistor to the source of a transfer transistor (refer or to H. Ohkubo et al., IEDM Technical Digest, 1991, pp.481–484).

This technique which suggests to add a resistor to the source of a transfer transistor of an SRAM, is very effective for stabilizing the operation of SRAM. According to the study by the present inventors, however, the characteristics of an SRAM cell depend greatly on process parameters.

SUMMARY OF THE INVENTION

It is an object of the present invention to provide an SRAM semiconductor device capable of providing stable characteristics while suppressing the influence of process parameters.

According to one aspect of the present invention, an SRAM semiconductor device is provided which includes a parallel connection of two series circuits each having a driver transistor and a lead connected in series, a wiring for connecting an interconnection point between the driver transistor and load of each of the two series circuits to a control terminal of the driver transistor of the other of the two series circuits, and a transfer transistor connected to each interconnection point, wherein the driver transistor and transfer transistor each are an insulating gate field effect transistor having a channel region formed on the surface of a semiconductor substrate at a predetermined area, source/drain regions on both sides of the channel region, and an insulated gate above the channel region, and the transfer transistor has a resistor region having an impurity concentration lower than the source/drain regions on both sides of the channel region of the driver transistor, the resistor region being contiguous to the channel region of the transfer transistor.

According to another aspect of the present invention, an SRAM semiconductor device is provided which includes a parallel circuit of two series circuits each having a driver transistor and a load connected in series, a wiring for connecting an interconnection point between the driver transistor and load of one of the two series circuits to a control terminal of the driver transistor of the other of the two series circuits, and a transfer transistor connected to each interconnection point, wherein the driver transistor and the transfer transistor each are an insulating gate field effect transistor having a channel region formed on the surface of a semiconductor substrate at a predetermined area, source/drain regions on both sides of the channel region, and an insulated gate above the channel region, wherein one of the source/drain regions of the driver transistor has an LDD structure, and the other of the source/drain regions has a single drain structure or a double-diffused drain structure, and the transfer-transistor has a resistor region having an impurity concentration lower than the other of the source/drain regions contiguous to the channel region of the driver transistor, the resistor region being contiguous to the channel region of the transfer transistor and outward of the insulated gate thereof.

An SRAM semiconductor device having a resistor connected to a transfer transistor can be manufactured by forming a resistor region contiguous to the channel region of the transfer transistor, the resistor region having an impurity concentration lower than the source/drain regions on both sides of the channel region of a driver transistor.

The process parameter dependency of transistor characteristics can be reduced by setting the impurity concentration of the source/drain regions of the driver transistor lower than the resistor region.

The drain region of the driver transistor connected to the channel region via a relatively low concentration region, and at the source region a relatively high concentration region and the channel region are serially connected. As a result, a leakage current can be suppressed, and a parasitic resistor serially connected to the channel region can be reduced.

DETAILED DESCRIPTION OF THE PREFERRED EMBODIMENTS

Figure 1A:
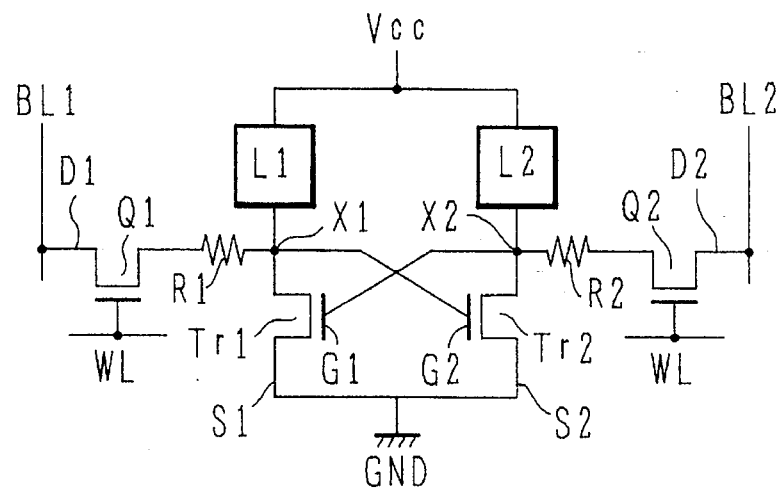
FIGS. 1A and 1B are an equivalent circuit diagram and a plan view of an SRAM semiconductor device.

FIG. 1A is an equivalent circuit diagram of an SRAM cell. The drain of a driver transistor Tr1 and a load L1 are serially connected, and this series connection is connected between a power source Vcc and ground potential GND. Similarly, the drain of a driver transistor Tr2 and a load L2 are serially connected, and this series connection is connected between the power source Vcc and ground potential GND.

The interconnection point X1 between the driver transistor Tr1 and load L1 is connected to the gate electrode G2 of the other driver transistor Tr2, and the interconnection point X2 between the driver transistor Tr2 and load L2 is connected to the gate electrode G1 of the other driver transistor Tr1.

The interconnection point X1 is also connected via a resistor R1 and a transfer transistor Q1 to a bit line BL1. The gate electrode Q1 of the transfer transistor Q1 is connected to a word line WL.

Similarly, the interconnection point X2 is also connected via a resistor R2 and a transfer transistor Q2 to a bit line BL2. The gate electrode Q2 of the transfer transistor Q2 is connected to the word line WL.

The present inventors tried to form driver transistors Tr, transfer transistors Q, and resistors R of the SRAM cell shown in FIG. 1A by manufacturing processes explained in FIGS. 8A–8E.

Figure 8A:
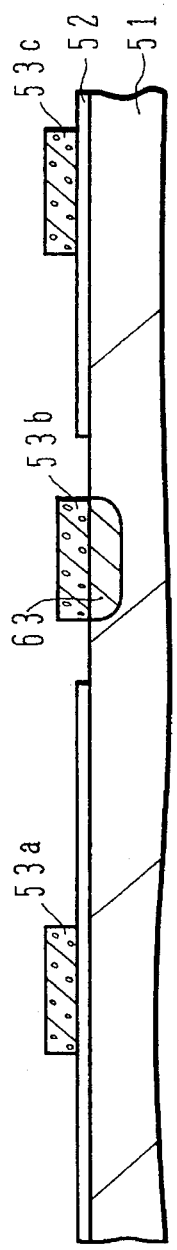
FIGS. 8A–8E are cross sectional views explaining the comparative manufacturing processes for the SRAM semiconductor device shown in FIG. 1.

First, a field oxide film was formed on the surface of a p⁻-type S1 substrate 51 so as to define each active region. Next, as shown in FIG. 8A, a gate oxide film 52 was formed on the surface of the active region. Boron (B) ions were implanted through the gate oxide film 52 into the substrate to control the impurity concentration of a channel region. Next, the gate oxide film 52 was selectively etched to open a contact area.

Next, a polycrystalline silicon layer 53 was deposited on the surface of the device, and patterned by reactive ion etching to form polycrystalline silicon regions 53a, 53b, and 53c. The polycrystalline silicon regions 53a and 53c on the gate oxide film 52 constitute the gate electrodes of MOS transistors, and the polycrystalline silicon region 53b on the surface of the Si substrate 51 constitutes an electrode for the contact area. These polycrystalline silicon regions have generally vertical side walls.

In FIG. 8A, an impurity diffusion region 63 is shown as formed by the diffusion of n-type impurities into the Si substrate 51 from the polycrystalline silicon region 53b on the contact area. This diffusion process may be performed at a later process.

Figure 8B:
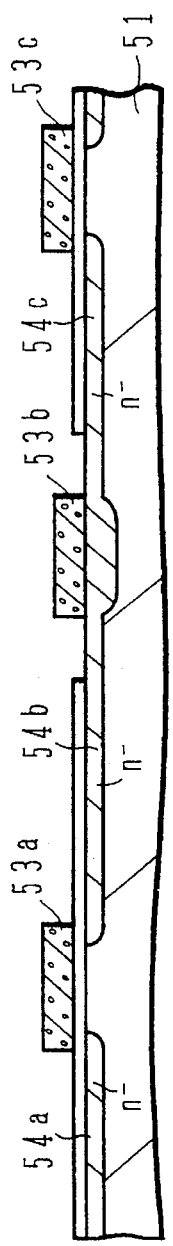

Next, as shown in FIG. 8B, using the polycrystalline silicon regions 53a, 53b, and 53c as mask, phosphorous (P) ions were implanted at a dose of about $1\times10^{13}\mathrm{cm}^{-2}$ to form lightly doped n⁻-type regions 54a, 54b, and 54c on the surface of the Si substrate 51.

Figure 8C:
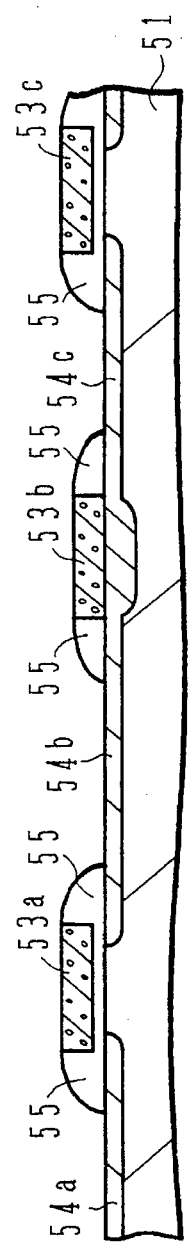

Next, as shown in FIG. 8C, an oxide film was deposited on the whole surface of the device by chemical vapor deposition (CVD), and subjected to anisotropic etching by reactive ion etching (RIE) to remove the oxide film on flat surfaces. Side wall oxide film regions 55 are left unetched at the side walls of the polycrystalline silicon regions 53a, 53b, and 53c. This RIE process is performed by using, for example, CHF₃ as an etching gas.

Figure 8D:
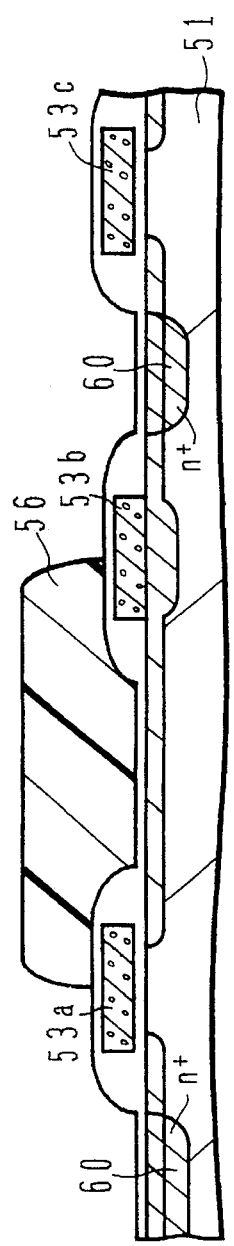

Next, as shown in FIG. 8D, a resist mask 56 was formed which extends from the gate electrode 53a of the transfer transistor to the electrode 53b on the contact area. Arsenic (As) ions were implanted at a dose of $4\times10^{15}\mathrm{cm}^{-2}$ to form n⁺-type regions 60 doped with impurities at a high concentration at the exposed areas near the gate electrodes 53a and 53e.

Figure 8E:
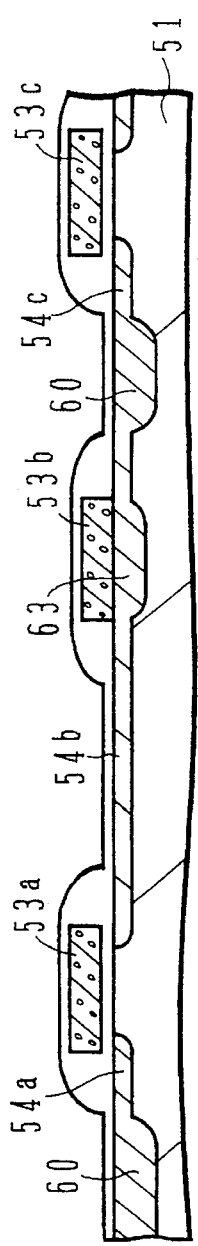

Thereafter, as shown in FIG. 8E, the resist mask 56 was removed. At this time, a transfer transistor is formed under the gate electrode 53a, and a resistor formed by the n⁻-type region 54b is connected to the source off the transfer transistor. A driver transistor is formed under the gate electrode 53c. Each transistor has a lightly doped drain (LDD) structure wherein the lightly doped n⁻-type region exists between the channel region and the n⁺-type region.

In the manufacturing processes explained in connection with FIGS. 8A–8E, the n⁻-type region 54b which constitutes a resistor and the n⁻-type regions which constitute the LDD structure of the transfer and driver transistors, are formed by the same process. It is required to lower the impurity concentration of the n⁻-type region 54 in order to obtain sufficiently high resistance values.

At the RIE process of forming the side wall oxide regions illustrated in FIG. 8C, the surface of n⁻-type region 54 is exposed. If at this RIE process part of the substrate surface is etched or damaged, the resistance values of the n⁻-type regions 54 change greatly. This change becomes conspicuous if the impurity concentration is lowered further so as to positively use the resistance of the source resistor. The optimum concentrations of the n-type regions of a LDD structure and a resistor are not necessarily same. If the performance of the driver transistor and other related transistors is to be designed with a priority over other performances, the impurity concentration becomes high and the value of a resistor becomes too low to exhibit a sufficient effect. On the other hand, if the resistance value is to be designed with a priority over other performances, the performance of transistors is degraded. Embodiments capable of solving such problems will be described below.

Returning back to FIGS. 1A and 1B, the circuit shown in FIG. 1A can be realized, for example, by a layout shown in FIG. 1B. The layout shown in FIG. 1B corresponds to the circuit portion of driver transistors Tr1 and Tr2, transfer transistors Q1 and Q2, and resistors R1 and R2 connected to the sources of the transfer transistors Q1 and Q2. Loads L1 and L2 are formed, for example, by thin film transistors on an insulating film deposited on the surface of the layout shown in FIG. 1B.

Figure 1B:
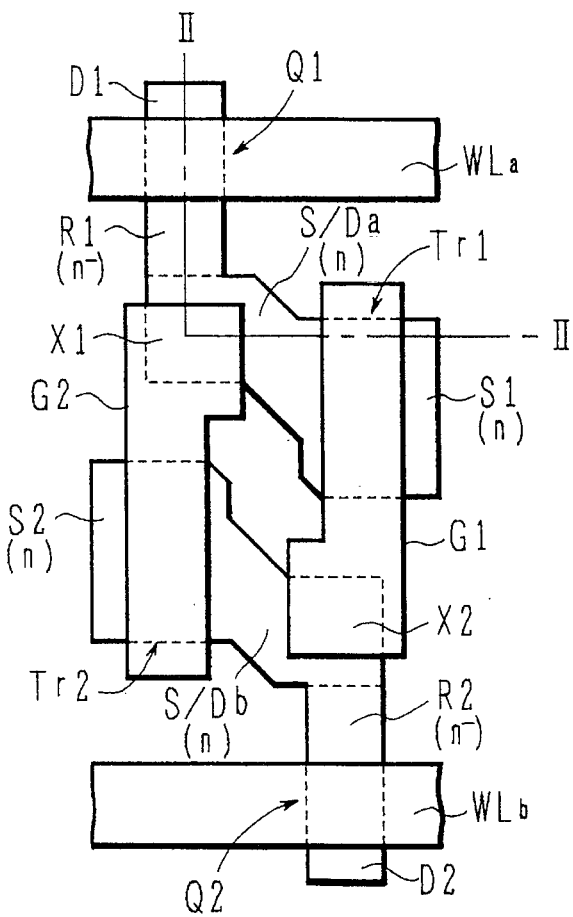

Referring to FIG. 1B, word lines WLa and WLb are disposed in the horizontal direction. Two MOS transistors are formed which have the channel regions under the word lines WLa and WLb, n-type source regions S/Da and S/Db on both sides of the channel regions, and drain regions D1 and D2.

Two gates G1 and G2 are disposed in the vertical direction between the word lines WLa and WLb. Two MOS transistors are formed which have the channel regions under the gate electrodes G1 and G2, n-type source regions S1 and S2 on botch sides of the gate electrodes, and drain regions S/Da and S/Db. The transistors under the gate electrodes G1 and G2 are the driver transistors Tr, and the transistors under the word lines WLa and WLb are the transfer transistors Q.

The transfer transistor Q1 under the word line WLa and the driver transistor Tr1 are serially connected by the n-type region S/Da and the n$^-$-type resistor region R1. The interconnection point X1 between these two transistors is connected to the gate G2.

The driver transistor Tr2 is formed under the gate electrode G2, and the transfer transistor Q2 is formed under the word line WLb. These two transistors are serially connected by the n-type region S/Db and the n$^-$-type resistor region R2, and the interconnection point therebetween is connected to the gate electrode G1.

As seen from FIG. 1B, a pair of the driver transistor Tr1 and transfer transistor Q1 and another pair of the driver transistor Tr2 and transfer transistor Q2 are realized by using symmetrical patterns.

In FIGS. 1A and 1B, the n-type regions of the source regions S1 and S2 and drain regions S/Da and S/Db of the driver transistors Tr are formed by the same manufacturing processes. The resistor regions R1 and R2 are lightly doped n-type regions formed by manufacturing processes different from the above-mentioned processes. The drains D of the transfer transistors Q1 and Q2 are formed by n-type regions. An n$^-$-type region which functions as a resistor may also be formed between the drain D and channel region.

A method of manufacturing an SRAM cell having the structure described above will be described with reference to FIGS. 2A to 2E which are cross sectional views taken along a phantom line II—II shown in FIG. 1B.

Figure 2A:
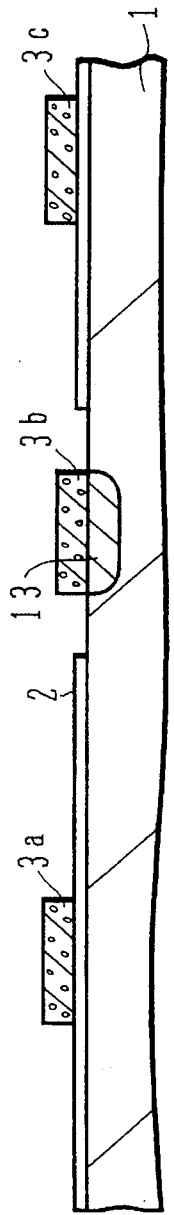
FIGS. 2A–2E, and 3A–3C are cross sectional views explaining the manufacturing processes for the SRAM semiconductor device shown in FIG. 1 according to an embodiment of the present invention.

A p-type Si substrate 1 is first prepared. A thick field oxide film is formed by thermal oxidation at the areas except active regions where semiconductor elements are formed. Next, a thin gate oxide film 2 is formed by thermal oxidation on the surface of the active regions of the Si substrate as shown in FIG. 2A.

For example, the thickness of the field oxide film is about 400 nm, and the thickness of the gate oxide film 2 is about 10 nm. Channel regions having a desired impurity concentration are formed, if necessary by injecting p-type impurities such as B via the gate oxide film 2 into the active regions of the Si substrate 1.

Next, the gate oxide film 2 at the area where a contact area is formed, is removed so as to expose the Si surface. A polycrystalline silicon layer 3 is deposited to a thickness of about 100 nm on the whole surface of the device, by CVD. A resist mask is formed on the polycrystalline silicon layer 3. By using this resist mask as etching mask, reactive ion etching (RIE) is performed using $Cl_2/O_2$ as an etching gas to pattern the polycrystalline silicon layer 3 and form gate electrodes 3a and 3c and electrode 3b on the contact area as shown in FIG. 2A. The RIE process leaves the side wall of the polycrystalline electrodes 3a, 3b and 3c substantially vertical.

Since the polycrystalline silicon film 3 has been doped with a great amount of n-type impurities (e.g., P), n-type impurities are diffused from the electrode 3b into the p$^-$-type Si substrate 1 so as to form an n$^-$-type region This n-type impurity diffusion from the electrode 8b may be performed at a later process.

Figure 2B:
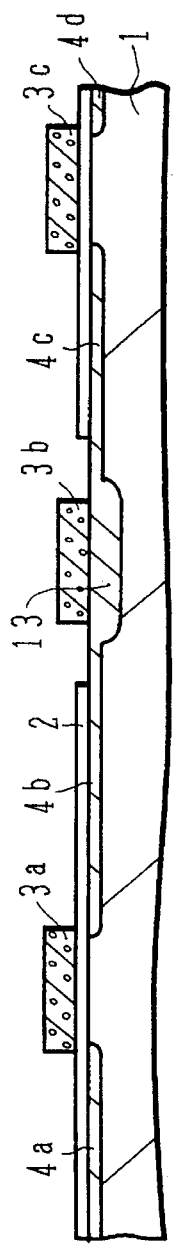

Next, as shown in FIG. 2B, by using the polycrystalline silicon layer 3 as mask, P ions are implanted at a dose of about $5\times10^{12} cm^{-2}$ to form n-type regions 4a, 4b, 4c, and 4d on both sides of the gate electrodes 3a and 3c and electrode 3b. The concentration of the n$^-$-type impurity region is set to a value suitable for forming a resistor region.

Figure 2C:
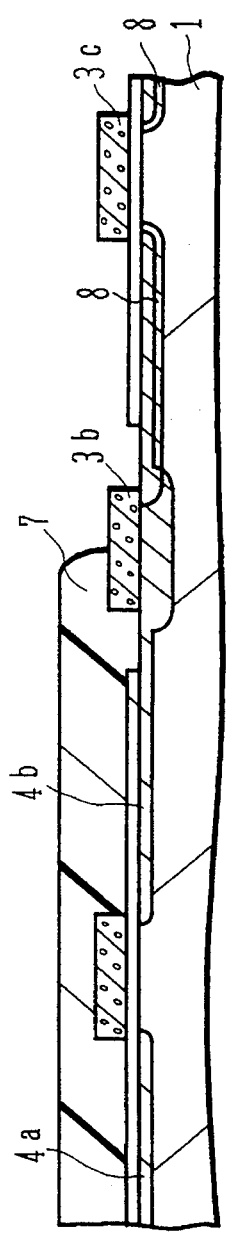

Next, as shown in FIG. 2C, a resist mask 7 is formed which extends from the leftmost in FIG. 2C to the center of the contact electrode 3b. By using this resist mask 7 and polycrystalline silicon film 3 as mask, P ions are implanted at a dose of about $1.5\times10^{13} cm^{-2}$ to form n-type regions 8 on both sides of the gate electrode 3c of the driver transistor. The impurity concentration of this n-type region 8 is set to a value suitable for forming an LDD structure of the driver transistor.

Figure 2D:
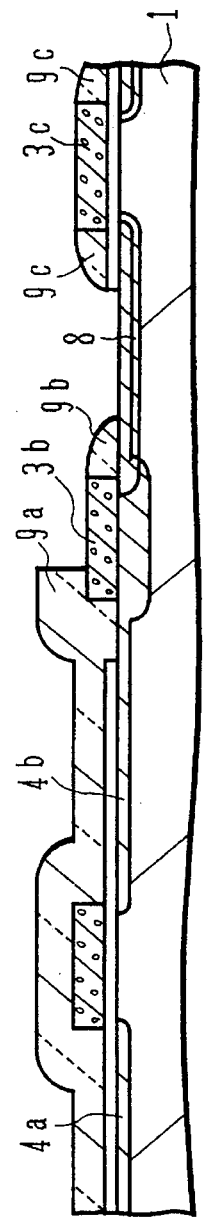

Next, as shown in FIG. 2D, after the resist mask 7 is removed, a Si oxide film 9 is deposited to a thickness of about 200 nm on the whole surface of the device. A resist mask similar to that explained with respect to FIG. 2C is formed on the Si oxide film 9.

By using the resist mask as etching mask, reactive ion etching (RITE) is performed using, for example, $CHF_3$ as an etching gas to thereby remove the exposed Si oxide film 9. At this time, the Si oxide film 9b and 9c is left unetched at substantially or generally the vertical side walls of the polycrystalline Si layer 3b and 3c, and side wall oxide regions are formed. The Si oxide film 9a at the left region covered with the resist mask is maintained as it is.

Figure 2E:
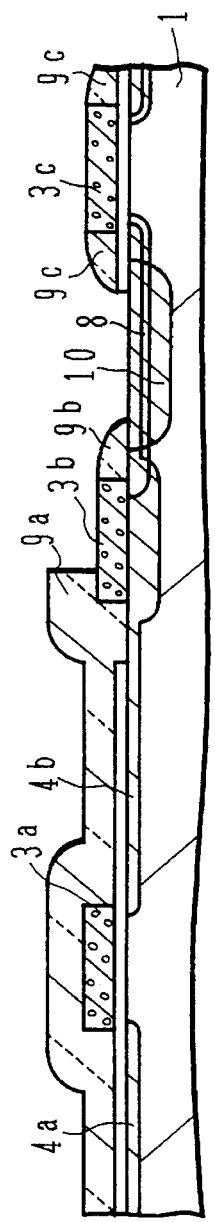

Succeedingly, as shown in FIG. 2E, by using as mask the contact electrode 3b, gate electrode 3c, side wall oxide film regions 9b and 9c, and Si oxide film 9a, As ions are implanted at a dose of about $4\times10^{15} cm^{-2}$ to thereby form n$^+$-type regions 10 having a high impurity concentration on both sides of the gate electrode 3c. This n$^+$-type region forms a drain/source electrode contact area having a high impurity concentration contiguous to the lightly doped drain/source region of the LDD structure.

In the structure shown in FIG. 2E, the resistor regions 4a and 4b having a low impurity concentration are connected to-the channel region under the gate electrode 3a, and the lightly doped source/drain regions 8 of the LDD structure having a relatively high impurity concentration are formed in the channel region under the gate electrode 3c.

By independently controlling the impurity concentrations of these regions, it becomes possible to set a desired cell ratio between transfer and driver transistors and to optimize the characteristics of driver transistors and the like.

At the process of forming the side wall oxide film regions illustrated in FIG. 2D, the area exposed by the RIE process is the area 8 which has a relatively high impurity concentration, thus preventing the device performance from being changed greatly with process parameters. The resistor regions 4a and 4b having a low impurity concentration are covered with the Si oxide film 9a, thus being isolated from the influence of the RIE process.

The left area of the gate electrode corresponding the drain region of the transfer transistor may be formed to have the same structure as the source/drain region of the driver transistor.

The structure shown in FIG. 2E provides an SRAM semiconductor device with a desired cell ratio which can be easily manufactured. The end portion of the Si oxide film 9a has almost the vertical side wall. This step may become an obstacle at later manufacturing processes.

Another manufacturing method which eliminate the obstacle of a Si oxide film step will be explained with reference to FIGS. 3A to 3C.

Figure 3A:
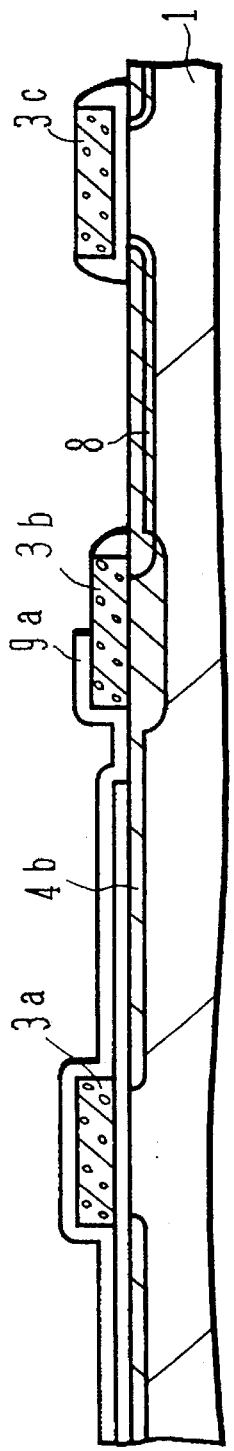

FIG. 3A is a cross sectional view of a semiconductor device after the lightly doped drain regions 8 are formed by processes similar to FIGS. 2A to 2D by using as mask the Si oxide film 9a and polycrystalline Si layer 3.

In this embodiment, the thickness of the Si oxide film 9a used as the mask is about 50 nm.

Figure 3B:
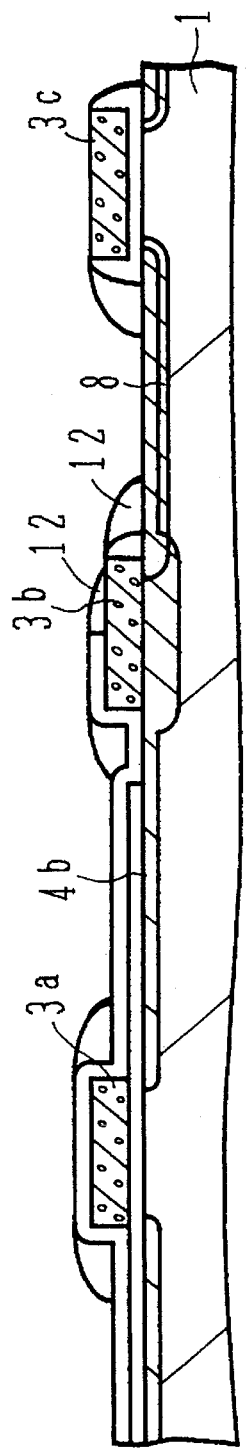

Next, as shown in FIG. 3B, an additional Si oxide film 12 is deposited by CVD to a thickness of about 150 nm. Thereafter, anisotropic etching is performed by RIE using $CHF_3$ so as to remove the Si oxide film 12 on the flat surface areas.

The Si oxide film 12 is left at the step portions as side wall oxide regions 12 which fill the step portions of the previously formed Si oxide film 9a and make them to have a gentle slope.

Figure 3C:
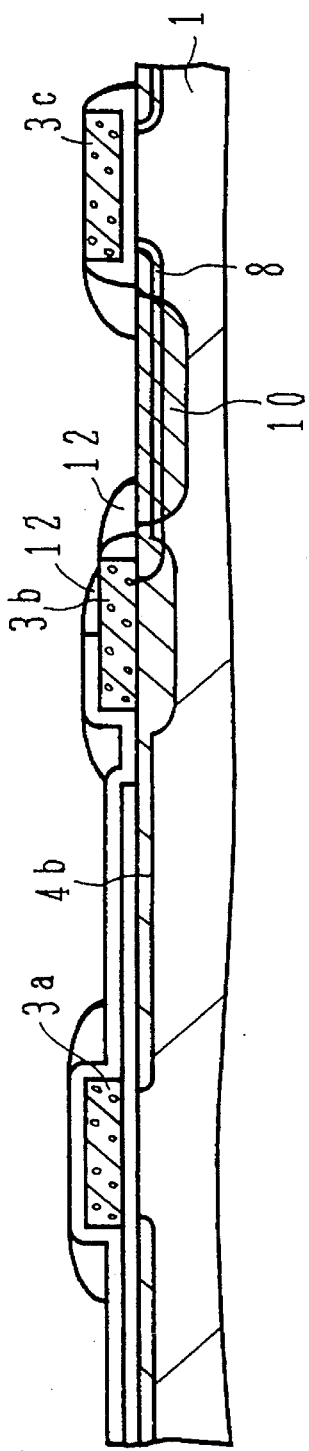

Thereafter, as shown in FIG. 3C, by using the Si oxide film and polycrystalline Si layer as mask, a highly doped source/drain electrode contact area 10 is formed by implanting As ions at a dose of $4\times10^{15} cm^{-2}$, which area is contiguous to the lightly doped source/drain region 8 of the driver transistor.

With the above manufacturing processes, the structure same as the embodiment shown in FIGS. 2A to 2E is formed on the surface of the semiconductor substrate. Furthermore, substantially the vertical steps on the surface of the semiconductor substrate are all covered with the side wall oxide regions and made to have a gentle slope.

The lightly doped n⁻-type region 4b which forms a resistor is always protected from the RIE process so that the value of the resistor can be made large and stable. Although the source/drain regions of the driver transistor having the LDD structure are exposed to the RIE process, the transistor characteristics are less dependent on RIE process parameters because the impurity concentration of the source/drain regions is relatively high. An ion implantation process may be performed between the processes of FIGS. 3A and 3B.

Figure 4:
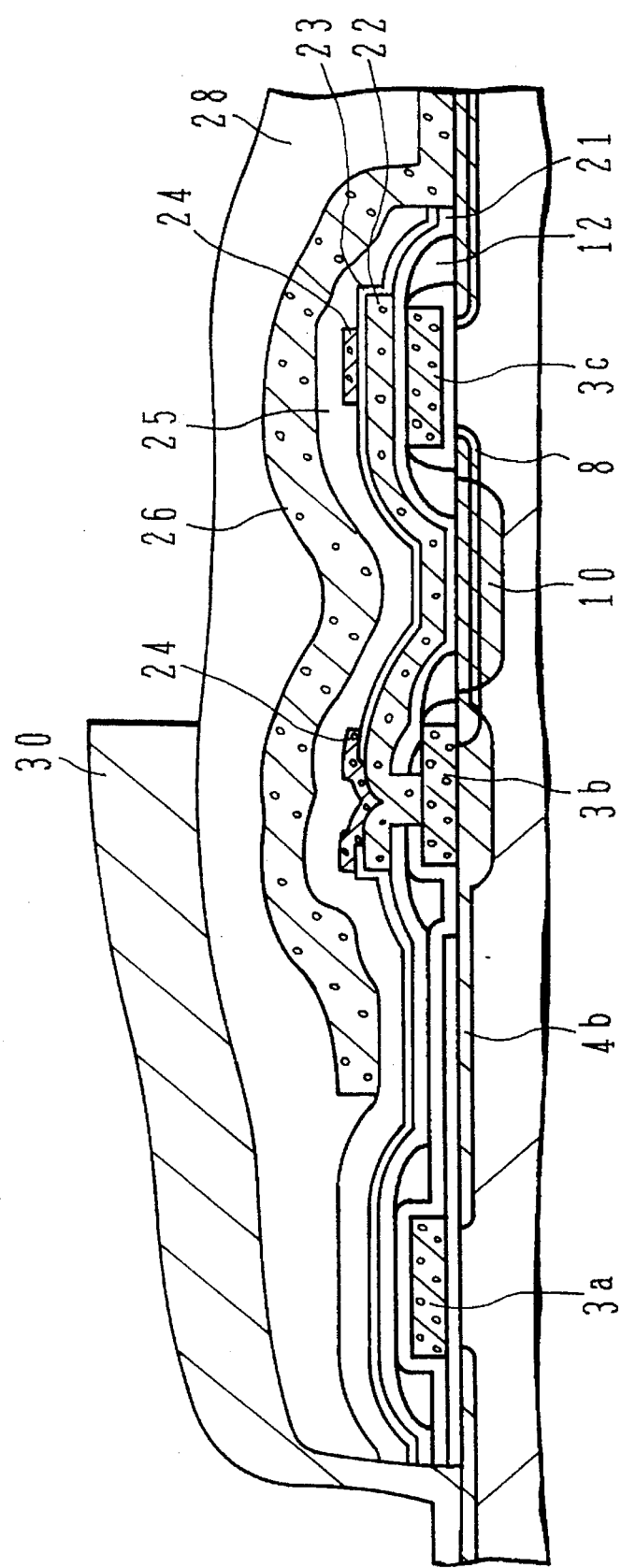
FIG. 4 is a cross sectional view of the SRAM semiconductor device.
Figure 5A:
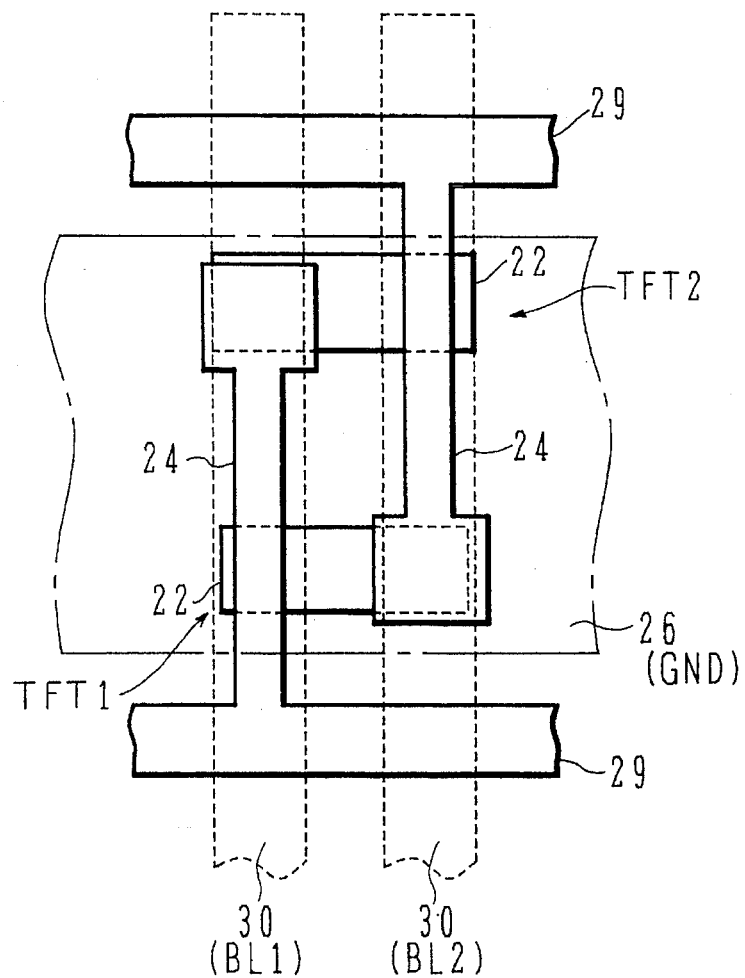
FIGS. 5A–5C are plan views and an equivalent circuit diagram of TFT loads.
Figure 5B:
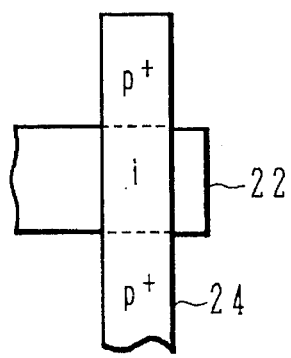
Figure 5C:
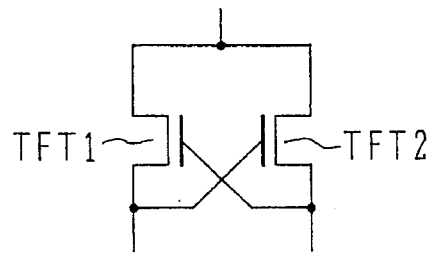

It is necessary to form loads of an SRAM. FIG. 4 and FIGS. 5A to 5C illustrate an example of the structure of loads which are formed by thin film transistors (TFTs). FIG. 4 is a cross sectional view of a load, and FIGS. 5A to 5C are plan views and an equivalent circuit of loads.

As shown in FIG. 4, a Si oxide film 21 is deposited, and thereafter a contact hole for the contact electrode 3b is formed. A polycrystalline silicon layer 22 doped with a great amount of n-type impurities is deposited on the Si oxide film 21 and patterned. A thin Si oxide film 23 as a gate insulating film is deposited covering the surface of the polycrystalline Si layer 22, and thereafter an opening is formed in the Si oxide film above the contact electrode 3b.

A polycrystalline Si layer 24 is deposited on the Si oxide film 23 and patterned to define a channel region of a TFT above the gate electrode 3c. The polycrystalline Si layer 24 is selectively doped with n-type impurities. A Si oxide film 25 is deposited covering the polycrystalline Si layer 24, and thereafter it is patterned.

A tungsten (W) polycide layer 26 is deposited covering the Si oxide film 25, and thereafter it is patterned. This W polycide layer 26 is ohmic-contacted to the source region of the driver transistor to form a ground line.

A boron phospho-silicate glass (BPSG) insulating film 28 is deposited covering the W polycide layer 26 and flattened by fellow process. Thereafter, an opening is patterned. An Al layer 30 is deposited on the BPSG layer 28 and patterned. This Al layer is ohmic-contacted to the drain region of the transfer transistor to form a bit line.

The layout of TFTs is shown in FIGS. 5A and 5B. First, the gate electrode 22 made of the n⁺-type polycrystalline Si layer is patterned, and a TFT current path region 24 made of the polycrystalline layer is formed partially covering the gate insulating film.

As shown in FIG. 5B, the TFT current path region 24 above the gate electrode 22 is undoped, and the region 24 on both sides of the gate electrode is doped with a great amount of p-type impurities to form p⁺-type regions. One end of the TFT current path region 24 is connected to the power source line 29, and the other end thereof is connected to the gate electrode 22 of the other TFT.

After the TFT structure is formed, the ground line 28 made of the W polycide layer is formed on the surface of the TFT structure. Thereafter, the bit line 30 made of the Al layer is formed on the BPSG layer.

FIG. 5C is an equivalent circuit of TFTs constructed as above.

It is important to increase a cell ratio in order to stabilize the operation of an SRAM cell. In this context, it is common that the channel length along the direction of current flow of a transfer transistor is made longer than a driver transistor.

Also important for the operation stabilization of an SRAM is the threshold values of transfer and driver transistors. Generally, channel impurity concentrations become different if different channel lengths of transfer and driver transistors are used.

In the above embodiments, the values of resistors connected to transfer transistors can be set arbitrarily so that it is not necessary to make the channel length of the transfer transistor longer than the driver transistor.

Furthermore, the impurity concentration of the source/drain region of a transfer transistor is lower than a driver transistor, sufficiently suppressing a short channel effect. Accordingly, the channel length of a transfer transistor may be made shorter than a driver transistor.

It is possible to set tire same channel impurity concentration to both transfer and driver transistors, by connecting suitable resistors to the transfer transistors. Accordingly, a selective ion impllantation process for providing different channel impurity concentrations is not necessary.

In the embodiment shown in FIGS. 1A, 1B, 2A–2E, the source and drain regions of the driver transistors Tr1 and Tr2 have an LDD structure.

The LDD structure is suitable for preventing the service life time of MOSFETs from being shortened by a hot electron effect. However, since the n⁻-type regions under the side wall oxide regions are serially connected to the channel region, the effects of parasitic resistance cannot be neglected and the on-current reduces. This is conspicuous particularly at the source area where negative feedback is active. From the above reasons, it is preferable not to incorporate an LDD structure into transistors which are less influenced by a hot electron effect.

A hot electron effect poses no significant problem the case of driver transistors of SRAM cells. It is not necessary therefore to use an LDD structure.

From the study of the present inventors, however, it has been found that driver transistors having a single drain structure or a double-diffused drain (DDS) structure have the following problem.

Figure 6:
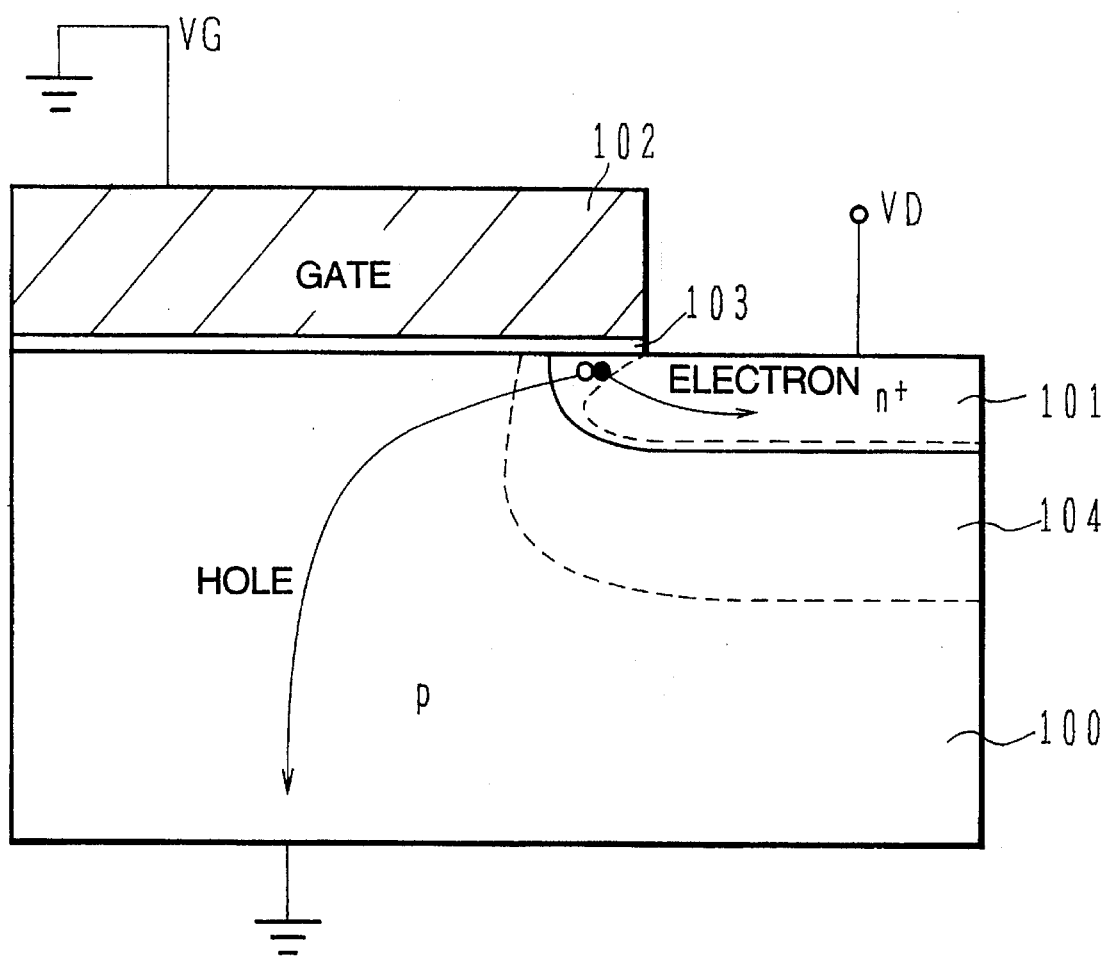
FIG. 6 is a schematic cross sectional view of a drain region, a channel region, and a gate electrode, explaining the generation of a leakage current, wherein the drain region of a MOSFET has a single drain structure.

FIG. 6 is a schematic cross sectional view showing the drain region, channel region, and gate electrode off a driver transistor incorporating a single drain structure into the drain region. A gate electrode 102 is formed on a partial surface area of a p-type silicon substrate 100, with a gate insulating film 103 being interposed therebetween. An n$^+$-type drain region 101 is formed on the exposed surface of the silicon substrate 100, the drain region 101 slightly crawling under the gate insulating film 103.

In a general n-channel MOSFET, the p-type substrate 100 is applied with a ground potential, and the drain region 101 is applied with a positive potential VD. Therefore, a depletion layer 104 is formed at the interface between the drain region 101 and p-type substrate 100.

When MOSFET is in an off-state, the gate electrode 102 is being applied with the ground potential or a voltage near the ground potential. As the gate oxide film 103 becomes thinner, the depletion layer crawls under the end portion of the drain region 101 having a high impurity concentration, thereby generating a higher electric field near the interface to the gate insulating film 103. As a result, the slope of a band edge near the surface becomes steep, thereby generating electron/hole pairs by a tunneling phenomenon. Electrons are moved toward the drain region 101 and holes are moved toward the silicon substrate 100, by the electric field, thus generating a drain-substrate current.

This current is a leakage current between the drain electrode and the ground potential line in the off-state of the transistor. It means an increase in a standby current of an SRAM cell circuit.

If the drain structure is an LDD structure, the impurity concentration of the drain region near the gate insulating film is low and the electric field is weakened. Therefore, no tunneling phenomenon occurs and a leakage current is not significant. However, if a single drain structure or a double-diffused drain structure is used, there is a problem of an increased standby current.

Next, another embodiment of the present invention will be described which can eliminate an increase of a standby current.

FIGS. 7A to 7E are cross sectional views of an SRAM taken along line II—II in FIG. 1B, illustrating the manufacturing method according to another embodiment of the present invention.

Figure 7A:
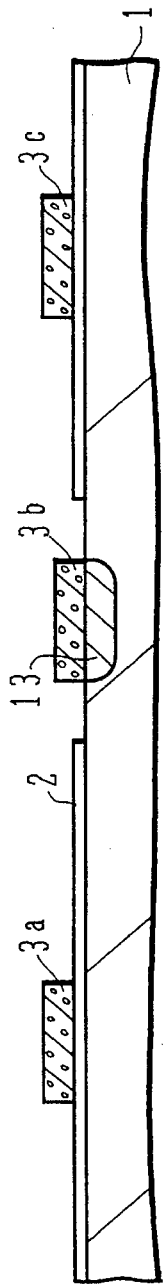
FIGS. 7A–7E are cross sectional views explaining the manufacturing processes for the SRAM semiconductor device shown in FIG. 1 according to another embodiment of the present invention.
Figure 7B:
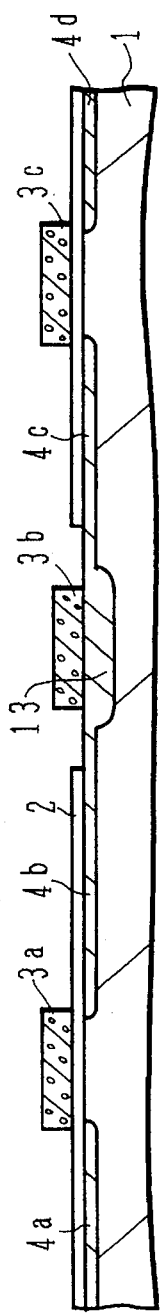

FIGS. 7A and 7B show the structures same as those shown in FIGS. 2A and 2B. The thickness of a gate insulating film 2 is about 10 nm, the thickness of polycrystalline silicon layer 3a, 3b, and 3c is about 150 nm, the impurity concentration of an n-type region under an electrode 3b is $1\times10^{21}$cm$^{-3}$, and the dose of n$^-$-type regions 4a to 4d is about $1.5\times10^{13}$cm$^{-2}$.

Figure 7C:
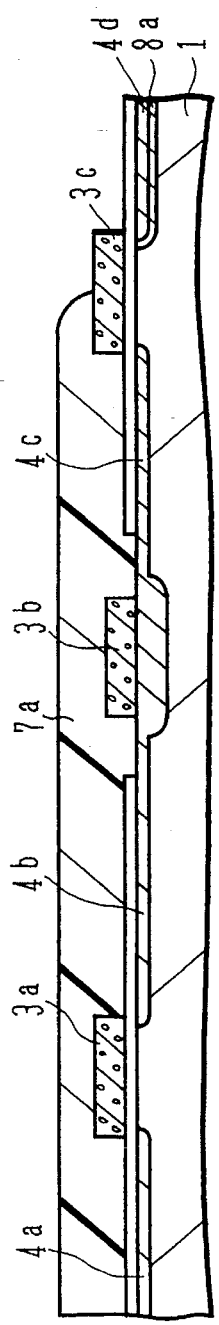

As shown in FIG. 7C, a resist mask 7a is formed extending from the leftmost side in FIG. 7C to the rightmost gate electrode 3c. By using the resist mask 7a and polycrystalline silicon layer 3 as mask, As ions are implanted to form an n$^+$-type region 8a at the source region of the gate electrode 3c. Phosphor (P) impurity ions are lightly doped at the process of FIG. 7B and arsenic (As) impurity ions are heavily doped at the process of FIG. 7C, thus forming a double-diffused drain structure.

Figure 7D:
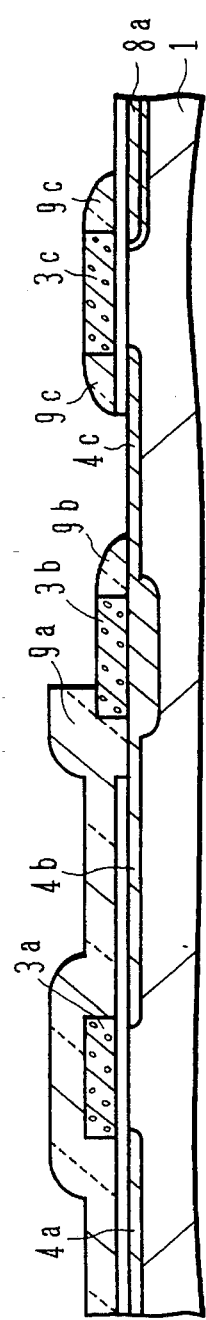

Next, as shown in FIG. 7D, after the resist mask 7a is removed, a Si oxide film 9 is deposited to a thickness of about 100 nm on the whole surface of the device by CVD.

Figure 7E:
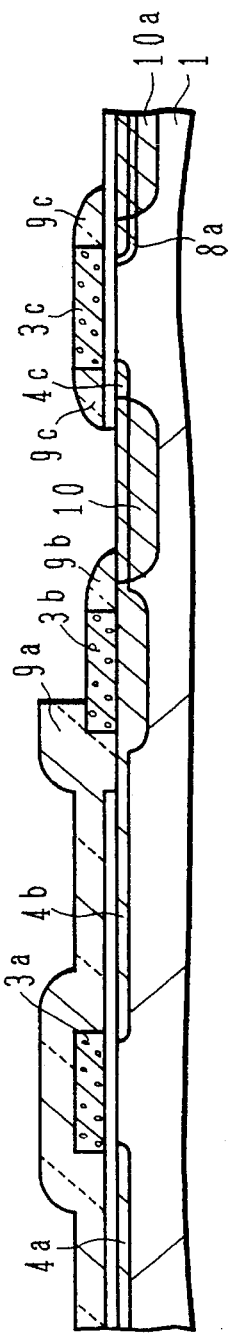

A resist mask is formed on the Si oxide film 9, extending to the leftmost side in FIG. 7E to the center contact electrode 3b.

Even if the n$^-$-type region of the source having the double-diffused drain structure extends laterally from the n$^+$-type region into an area below the gate electrode and the channel length becomes short, the region below the gate electrode does not form resistance components.

By using the resist mask, the exposed Si oxide film 9 on the flat planes is removed by reactive ion etching (RIE) using, for example, CHFs as an etching gas. At this time, the Si oxide films 9b and 9c at substantially the vertical side walls of the polycrystalline Si layers 3b and 3c are unetched, forming side wall oxide regions. The Si oxide film 9a at the left side area covered by the mask remains at it is.

Next, as shown in FIG. 7E, using the electrode 3a, gate electrode 3c, side wall oxide regions 9b and 9c, and Si oxide film 9a as mask, As ions are implanted at a dose of about $3\times10^{15}$cm$^{-2}$ to form n$^+$-type regions 10 and 10a on both sides of the gate electrode 3c. The n$^+$-type region 10 on the drain region side (left side in FIG. 7E) of the gate electrode 3c forms a drain electrode contact area having a high impurity concentration and being contiguous to the drain 4c having LDD structure.

The n$^+$-type region lea on the source region side (right side in FIG. 7E) of the gate electrode 3c forms a source electrode contact area contiguous to the n$^+$-type source region 8a. In this way, by heavily doping impurity ions by using the gate electrode 3c as the mask at the process of FIG. 7C, it is possible to form the source region of the driver transistor having a DDD structure instead of an LDD structure.

At the process shown in FIG. 7B, a mask (not shown) covering the area where a p-channel transistors are formed may be extended to the right side area of the gate electrode 3c. In this case, the source region of the driver transistor has a single drain structure having only the n$^+$-type region 8a formed at the process of FIG. 7C.

The different points of the structure shown in FIG. 7E from that shown in FIG. 2E are the source structure of the driver transistor and the impurity concentration of the low concentration area of the drain region. In the embodiment shown in FIGS. 7A to 7E, the drain structure of the driver transistor can be made to be an LDD structure, and the source structure can be made to be a single drain structure or a double-diffused drain structure.

By making the source region to have a single drain structure or a double-diffused structure and connecting the channel region directly to the n$^+$-type source region, it is possible to suppress a decrease of an on-current of the transistor.

In the embodiment shown in FIGS. 7A to 7E, MOSFETs of a peripheral circuit may be made to have an LDD structure by the same method used for the drain region of the driver transistor.

Although the terms source and drain are used in the above description, a same transistor may be used to allow a current in both directions. Thus, the distinction of source and drain may not necessarily be made. The terms source and drain may be reversed or replaced with an integrated concept source/drain in the above description.

The present invention has been described in connection with the preferred embodiments. The invention is not limited only to the above embodiments. It is apparent for those skilled in the art that various modifications, improvements, combinations and the like can be made.

We claim:

1. An SRAM semiconductor device, comprising:

a pair of bit line wirings;

a word line wiring;

a parallel connection of two series circuits each having a driver transistor and a load connected in series;

a wiring for connecting an interconnection point between said driver transistor and said load of one of said two series circuits to a control terminal of said driver transistor of the other of said two series circuits;

a transfer transistor having current electrodes connected to each said interconnection point and an associated one of said bit line wirings, and a control electrode connected to said word line wiring; and an insulating film covers a resistor region, and has an aperture over the driver transistor, wherein said driver transistor and said transfer transistor each are an insulated gate field effect transistor having a channel region formed in the surface of a semiconductor substrate at a predetermined area, source and drain regions on opposite sides of said channel region, and an insulated gate above said channel region, and wherein said transfer transistor has said resistor region having an impurity concentration lower than that in said source region of said driver transistor, said resistor region being disposed outward of said insulated gate of said transfer transistor.

2. An SRAM semiconductor device, comprising:

a parallel connection of two series circuits each having a driver transistor and a load connected in series;

a wiring for connecting an interconnection point between said driver transistor and said load of one of said two series circuits to a control terminal of said driver transistor of the other of said two series circuits; and a transfer transistor connected to each said interconnection point, wherein said driver transistor and said transfer transistor each are an insulated gate field effect transistor having a channel region formed on the surface of a semiconductor substrate, source and drain regions disposed on both sides of said channel region, and an insulated gate disposed above said channel region, wherein said drain region of said driver transistor has an LDD structure, and said source region has a single drain structure or a double-diffused drain structure, and wherein said transfer transistor has a resistor region having an impurity concentration lower than that in said source region of said driver transistor, said resistor region being contiguous to said channel region of said transfer transistor.

3. An SRAM semiconductor device according to claim 2, further comprising an insulating film covering the upper area of said resistor region.

4. An SRAM semiconductor device according to claim 2, wherein the other of said source/drain regions of said driver transistor includes a first region having a first impurity concentration, said first region being contiguous to said channel region of said driver transistor and disposed outward of said insulated gate of said driver transistor, and a second region having a second impurity concentration higher than said first impurity concentration, said second region being contiguous to said first region.

5. An SRAM semiconductor device, comprising:

a pair of bit line wirings;

a word line wiring;

a parallel connection of two series circuits each having a driver transistor and a load connected in series;

a wiring for connecting an interconnection point between said driver transistor and said load of one of said two series circuits to a control terminal of said driver transistor of the other of said two series circuits;

a transfer transistor having current electrodes connected to each said interconnection point and an associated one of said bit line wirings, and a control electrode connected to said word line wiring, wherein said driver transistor and said transfer transistor each are an insulated gate field effect transistor having a channel region formed in the surface of a semiconductor substrate at a predetermined area, source and drain regions on opposite sides of said channel region, and an insulated gate above said channel region, and wherein said transfer transistor has a resistor region having an impurity concentration lower than that in said source region of said driver transistor, said resistor region being contiguous to said channel region of said transfer transistor;

an insulating film covering said resistor region; and a polycrystalline semiconductor regions having the same conductivity type as said source/drain regions of said driver transistor and formed on the surface of said semiconductor substrate, and a contact region including a low resistance formed by impurity diffusion from said polycrystalline semiconductor region, said polycrystalline semiconductor region and said contact region being disposed between said driver transistor and said transfer transistor.

6. An SRAM semiconductor device according to claim 5, wherein said insulating film has substantially a vertical side wall on said polycrystalline semiconductor region, and said insulated gate of said driver transistor includes a polycrystalline semiconductor gate electrode having substantially vertical side walls and side wall insulating material regions formed at said substantially vertical side walls of said polycrystalline semiconductor gate electrode.

7. An SRAM semiconductor device according to claim 6, further comprising a side wall insulating material region formed at said substantially vertical side wall of said insulating film.

8. An SRAM semiconductor device according to claim 5, wherein the width of said insulated gate of said transfer transistor is narrower than the width of said insulated gate of said driver transistor, and the impurity concentration of said channel region of said transfer transistor is substantially the same as the impurity concentration of said channel region of said driver transistor.

9. An SRAM semiconductor device according to claim 5, wherein a gate length of said transfer transistor is shorter than a gate length of said driver transistor.

10. An SRAM semiconductor device according to claim 5, wherein said channel region of said transfer transistor has substantially the same impurity concentration as said channel region of said driver transistor.

11. An SRAM semiconductor device according to claim 5, wherein said resistor region has a higher impurity concentration than said channel region.

* * * * *